United States Patent
Kaneko

(10) Patent No.: US 12,362,175 B2
(45) Date of Patent: Jul. 15, 2025

(54) METHOD FOR MANUFACTURING SiC SUBSTRATE

(71) Applicants: KWANSEI GAKUIN EDUCATIONAL FOUNDATION, Hyogo (JP); TOYOTA TSUSHO CORPORATION, Nagoya (JP)

(72) Inventor: Tadaaki Kaneko, Sanda (JP)

(73) Assignees: KWANSEI GAKUIN EDUCATIONAL FOUNDATION, Hyogo (JP); TOYOTA TSUSHO CORPORATION, Nagoya (JP)

(\*) Notice: Subject to any disclaimer, the term of this patent is extended or adjusted under 35 U.S.C. 154(b) by 316 days.

(21) Appl. No.: 17/761,086

(22) PCT Filed: Sep. 24, 2020

(86) PCT No.: PCT/JP2020/036002
§ 371 (c)(1),
(2) Date: Mar. 16, 2022

(87) PCT Pub. No.: WO2021/060367
PCT Pub. Date: Apr. 1, 2021

(65) Prior Publication Data
US 2022/0344152 A1    Oct. 27, 2022

(30) Foreign Application Priority Data

Sep. 27, 2019  (JP) ................... 2019-176574

(51) Int. Cl.
*H01L 21/02* (2006.01)
*C30B 33/02* (2006.01)
(Continued)

(52) U.S. Cl.
CPC .......... *H01L 21/0262* (2013.01); *C30B 33/02* (2013.01); *C30B 33/12* (2013.01);
(Continued)

(58) Field of Classification Search
CPC .......... H01L 21/0262; H01L 21/02378; H01L 21/30625; H01L 21/02529; H01L 21/045;
(Continued)

(56) References Cited

U.S. PATENT DOCUMENTS

| 2004/0067622 A1 | 4/2004 | Akatsu et al. |
| 2016/0118257 A1* | 4/2016 | Kaneko ................... C30B 29/36 438/492 |

(Continued)

FOREIGN PATENT DOCUMENTS

| CN | 1774798 A | 5/2006 |
| EP | 4012078 A1 | 6/2022 |

(Continued)

OTHER PUBLICATIONS

English Translation w/ Paragraphs of JPWO-2017188381-A1.*
(Continued)

*Primary Examiner* — Julio J Maldonado
*Assistant Examiner* — Nathan Pridemore
(74) *Attorney, Agent, or Firm* — Calfee, Halter & Griswold LLP

(57) ABSTRACT

The present invention addresses the problem of providing novel techniques for manufacturing a SiC substrate that enables reduced material loss when a strained layer is removed. The present invention is a method for manufacturing a SiC substrate 30 which includes a strained layer thinning step S1 for thinning a strained layer 12 of a SiC substrate body 10 by moving the strained layer 12 to a surface side. Including such a strained layer thinning step S1 in which the strain layer is moved to (concentrated toward) the surface side makes it possible to reduce material loss L when removing the strained layer 12.

11 Claims, 7 Drawing Sheets

(51) Int. Cl.
*C30B 33/12* (2006.01)
*H01L 21/306* (2006.01)
*H10D 62/832* (2025.01)

(52) U.S. Cl.
CPC .. *H01L 21/02378* (2013.01); *H01L 21/02529* (2013.01); *H01L 21/30625* (2013.01); *H10D 62/8325* (2025.01)

(58) Field of Classification Search
CPC ............. H01L 21/0445; H01L 21/02; H01L 21/02002; H01L 21/02005; H01L 29/1608; H01L 29/66053; H01L 29/6606; H01L 29/66068; H01L 29/30; H01L 29/32; H01L 29/34; C30B 33/12; C30B 33/02; C30B 23/06; C30B 23/063; C30B 23/066; C30B 33/00; C30B 35/002; C30B 29/36; H10D 62/50; H10D 62/53; H10D 62/57; H10D 62/8325
See application file for complete search history.

(56) References Cited

U.S. PATENT DOCUMENTS

| | | | |
|---|---|---|---|
| 2016/0133465 A1 | 5/2016 | Sasaki | |
| 2017/0114475 A1* | 4/2017 | Yabuki | H01L 21/3065 |
| 2017/0236905 A1* | 8/2017 | Torimi | H01L 21/304 257/77 |
| 2019/0010629 A1* | 1/2019 | Yabuki | C30B 9/00 |
| 2019/0136409 A1 | 5/2019 | Kaneko et al. | |

FOREIGN PATENT DOCUMENTS

| | | | | |
|---|---|---|---|---|
| EP | 4012079 A1 | 6/2022 | | |
| EP | 4012080 A1 | 6/2022 | | |
| JP | 2007-115875 A | 5/2007 | | |
| JP | 2011-233780 A | 11/2011 | | |
| JP | 2015-005702 A | 1/2015 | | |
| JP | 2018158858 A * | 10/2018 | | |
| WO | 2014/199615 A1 | 12/2014 | | |
| WO | WO-2017188381 A1 * | 11/2017 | | C30B 23/02 |
| WO | WO-2019167337 A1 * | 9/2019 | | C30B 23/025 |

OTHER PUBLICATIONS

English Translation w./Paragraphs of WO-2019167337-A1.*
Merged Document from PE2E WO2017188381A1.*
Merged Document from PE2E WO2019167337.*
English Translation of International Search Report from PCT/JP2020/036002 dated Dec. 1, 2020 (3 pages).
European Search Report issued in EP application No. 20868266.6 dated Sep. 25, 2023 (7 pages).

* cited by examiner

FIG. 4
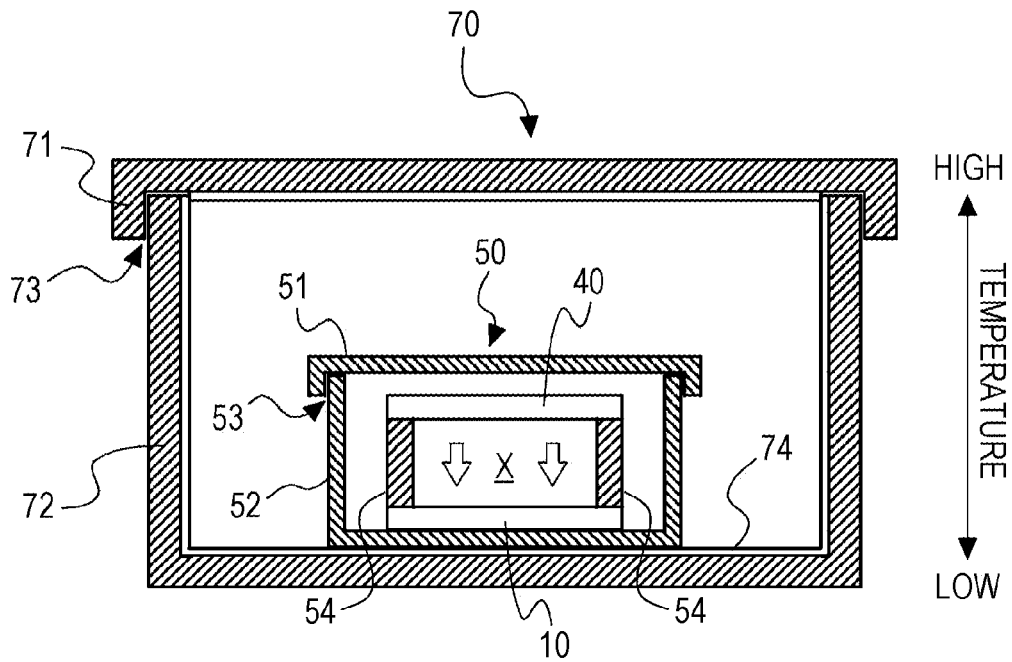
(a)
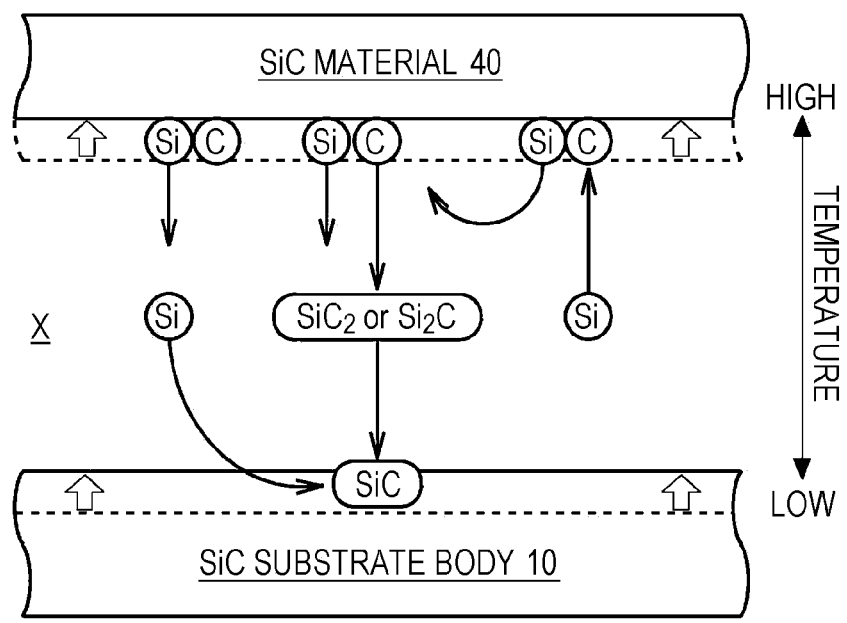
(b)

FIG. 5
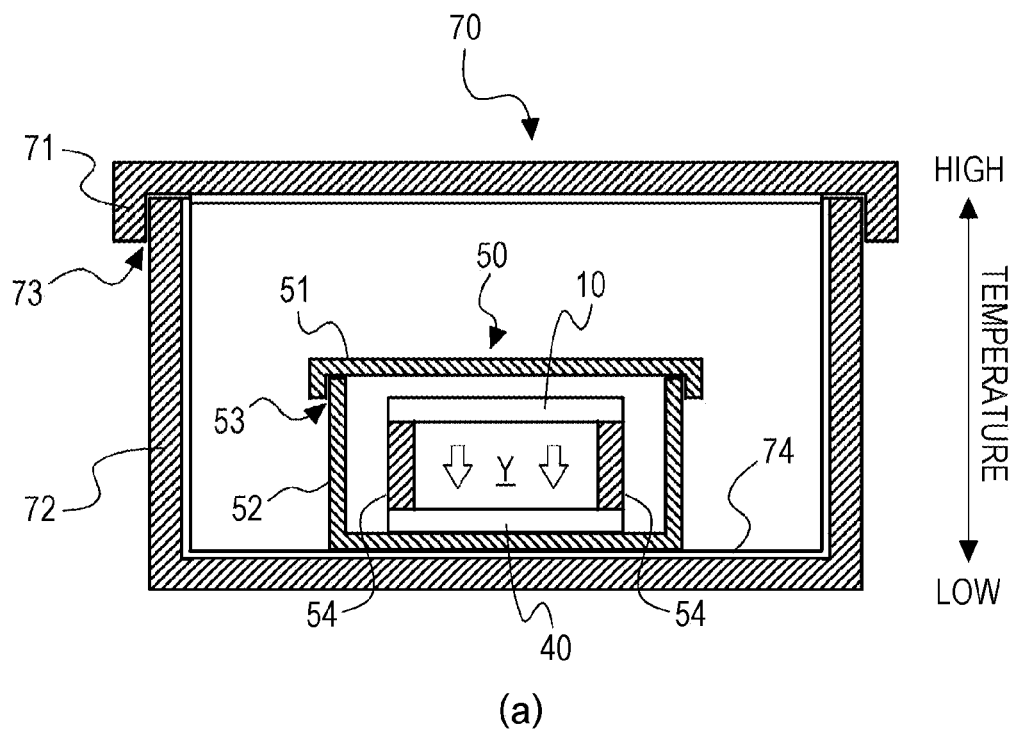
(a)
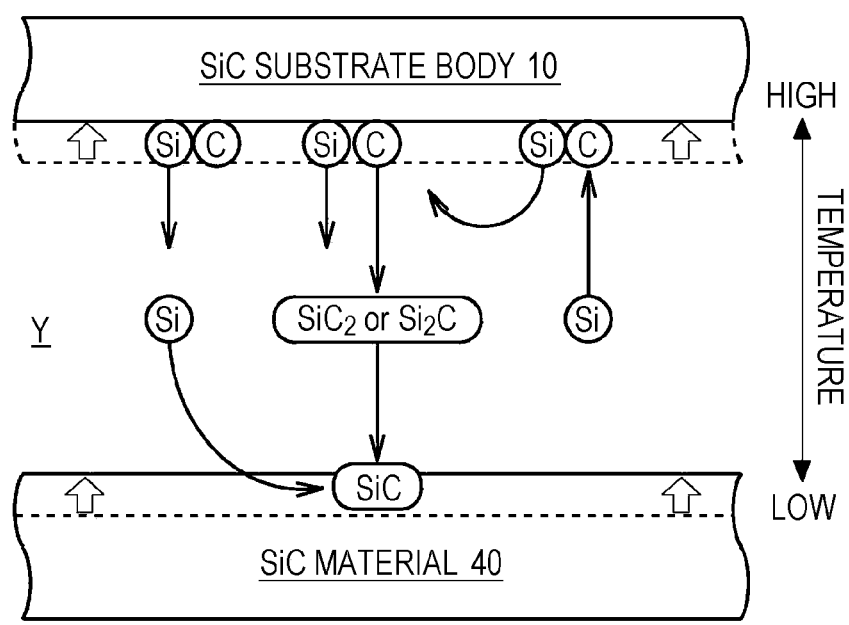
(b)

METHOD FOR MANUFACTURING SiC SUBSTRATE

CROSS-REFERENCE TO RELATED APPLICATIONS

This application is a 371 of PCT Application No. PCT/JP2020/036002, filed on Sep. 24, 2020, which claims priority to Japanese Application No. 2019-176574, filed on Sep. 27, 2019, the contents of which are hereby incorporated by reference as if recited in their entirety.

TECHNICAL FIELD

The present invention relates to a method for producing a SiC substrate.

BACKGROUND ART

SiC (silicon carbide) substrates are formed by slicing a single crystal SiC ingot. On the surface of the sliced SiC substrate, there is a surface layer with crystal strains, scratches, and the like introduced during the slicing step (hereinafter referred to as the subsurface damaged layer). In order not to reduce the yield in the device production process, it is necessary to remove this subsurface damaged layer.

In related art, machining has been used to remove this subsurface damaged layer and obtain an epi-ready SiC substrate that can be grown epitaxially for producing SiC devices. This machining generally includes a rough grinding step using abrasive grains such as diamond, a finish grinding step using abrasive grains having a particle size smaller than that of the abrasive grains used in the rough grinding step, and a chemical mechanical polishing (CMP) step of performing polishing using a mechanical action of a polishing pad and a chemical action of slurry in combination (See, for example, Patent Literature 1).

CITATION LIST

Patent Literature

Patent Literature 1: JP 2015-5702 A

SUMMARY OF INVENTION

Technical Problem

The subsurface damaged layer is considered to have a cracked layer with many cracks (scratches) and a strained layer with strain on the crystal lattice. This strained layer is introduced deeper into the SiC substrate than the crack layer. Therefore, the removal of the strained layer required the removal of tens to hundreds of micrometers of single crystal SiC. This resulted in a large amount of material loss.

In particular, when the strained layer is removed by CMP, it is necessary to spend several hours to remove single crystal SiC of several μm to more than ten μm, which is a problem of high cost for CMP and long processing time.

In view of the aforementioned problems, the problem to be solved by the present invention is to provide a novel technology for producing SiC substrates that can reduce the amount of material loss when removing the strained layer.

Solution to Problem

The present invention, which solves the above-mentioned problem, is a method for producing a SiC substrate, including a strained layer thinning step of thinning the strained layer of the SiC substrate body by moving the strained layer to the surface side.

The inclusion of the step of moving (concentrating) the strained layer to the surface side reduces the amount of material loss of the SiC substrate body in the subsequent strained layer removal step. This will further reduce the processing cost and time in the strained layer removal step.

A preferred mode of the present invention includes a strained layer removal step of removing the strained layer, in which the strained layer thinning step is a step of moving the strained layer after the strained layer thinning step to the surface side than a reference depth, the reference depth being the depth of the strained layer before the strained layer thinning step, and the strained layer removal step is a step of removing at least a portion of the surface side above the reference depth. As described above, the amount of material loss in the SiC substrate body can be reduced by moving the strained layer to the surface side and removing it from the reference depth where it was previously removed.

In a preferred mode of the present invention, the strained layer removal step is chemical mechanical polishing.

As described above, by moving the strained layer of the SiC substrate body to the surface side, the strained layer is made thinner, and then chemical mechanical polishing is applied to form an epi-ready surface while reducing the amount of material loss and cost.

In a preferred mode of the present invention, the strained layer removal step is thermal etching.

As described above, by using thermal etching for the strained layer removal step, the movement of the strained layer and the removal of the strained layer can be performed simultaneously. That is, the strained layer thinning step and the strained layer removal step can be performed simultaneously.

A preferred mode of the present invention further includes a slicing step of slicing an ingot to obtain a SiC substrate body, in which the slicing step is a step of obtaining a SiC substrate body having a thickness obtained by adding a thickness of 100 μm or less to the thickness of the SiC substrate body after the strained layer removal step.

The slicing step is a step of obtaining a SiC substrate body having a thickness obtained by adding a thickness of 50 μm or less to the thickness of the SiC substrate body after the strained layer removal step.

By slicing the SiC substrate body at such a thickness, the number of SiC substrate bodies taken from one ingot can be increased, and the unit cost per substrate can be reduced.

A preferred mode of the present invention further includes an etching step of etching the surface of the SiC substrate body, in which the etching step is wet etching.

By wet etching the SiC substrate body, the surface can be planarized while removing impurities deposited in the slicing step.

In a preferred mode of the present invention, the etching step uses one or more kinds of etchants selected from the group consisting of a potassium hydroxide melt, chemical solutions containing hydrofluoric acid, a potassium permanganate-based chemical solution, and tetramethyl ammonium hydroxide.

A preferred mode of the present invention includes a slicing step of slicing an ingot to obtain a SiC substrate body, and includes the slicing step, the etching step, and the strained layer thinning step in this order.

In a preferred mode of the present invention, the strained layer thinning step is a step of heating the SiC substrate body in an environment containing Si elements.

In a preferred mode of the present invention, the strained layer thinning step is a step of heating the SiC substrate body in a semi-closed space containing a Si element supply source and a C element supply source.

In a preferred mode of the present invention, the strained layer thinning step is a step of heating the SiC substrate body in a main container including a SiC material.

In a preferred mode of the present invention, the strained layer thinning step is a step of placing the SiC substrate body and the SiC material to face each other and performing heat treatment so as to form a temperature gradient between the SiC substrate body and the SiC material.

In a preferred mode of the present invention, the strained layer thinning step is a step of heating the SiC substrate body in a Si-vapor pressure environment.

In a preferred mode of the present invention, the strained layer thinning step is a metastable solvent epitaxy method.

In a preferred mode of the present invention, the heating temperature of the strained layer thinning step is 1400° C. or higher and 1600° C. or lower.

Advantageous Effects of Invention

The disclosed technology can provide a novel technology for producing SiC substrates that can reduce the amount of material loss when removing the strained layer.

Other problems, features, and advantages will become apparent by reading the embodiments for implementing the present invention described below, when taken up together with the drawings and claims.

BRIEF DESCRIPTION OF DRAWINGS

FIG. 4 illustrates an overview of the strained layer thinning step according to the embodiment.

FIG. 5 illustrates an overview of the strained layer thinning step according to the embodiment.

DESCRIPTION OF EMBODIMENTS

The following is a description of a preferred mode of the present invention with reference to the drawings. The technical scope of the present invention is not limited to the embodiments depicted in the accompanying drawings, and may be modified as necessary within the scope of the claims.

<<Method for Producing SiC Substrate>>

Figure 1:
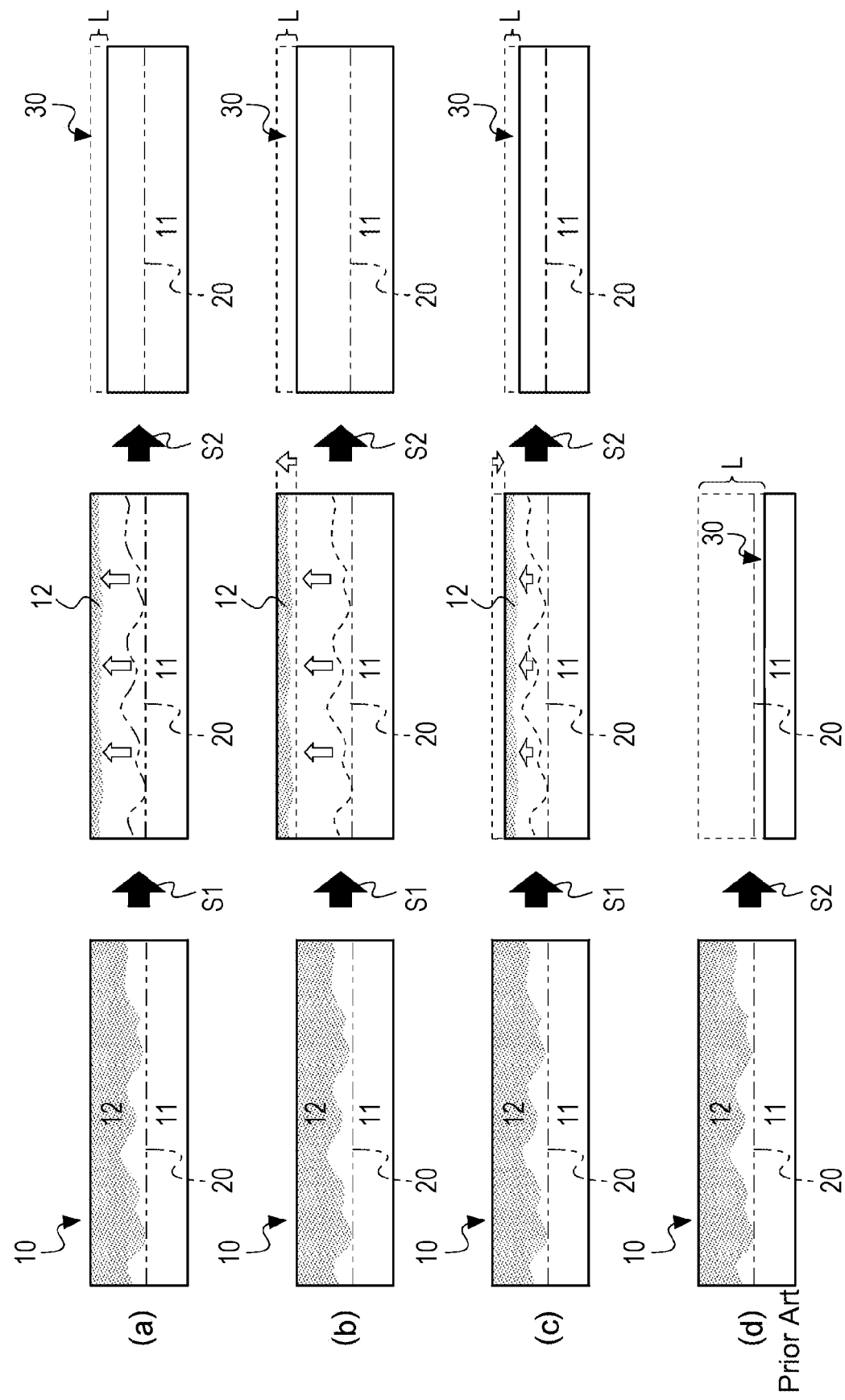
FIG. 1 illustrates the production process of SiC substrates according to the present invention and a related-art method.
Figure 2:
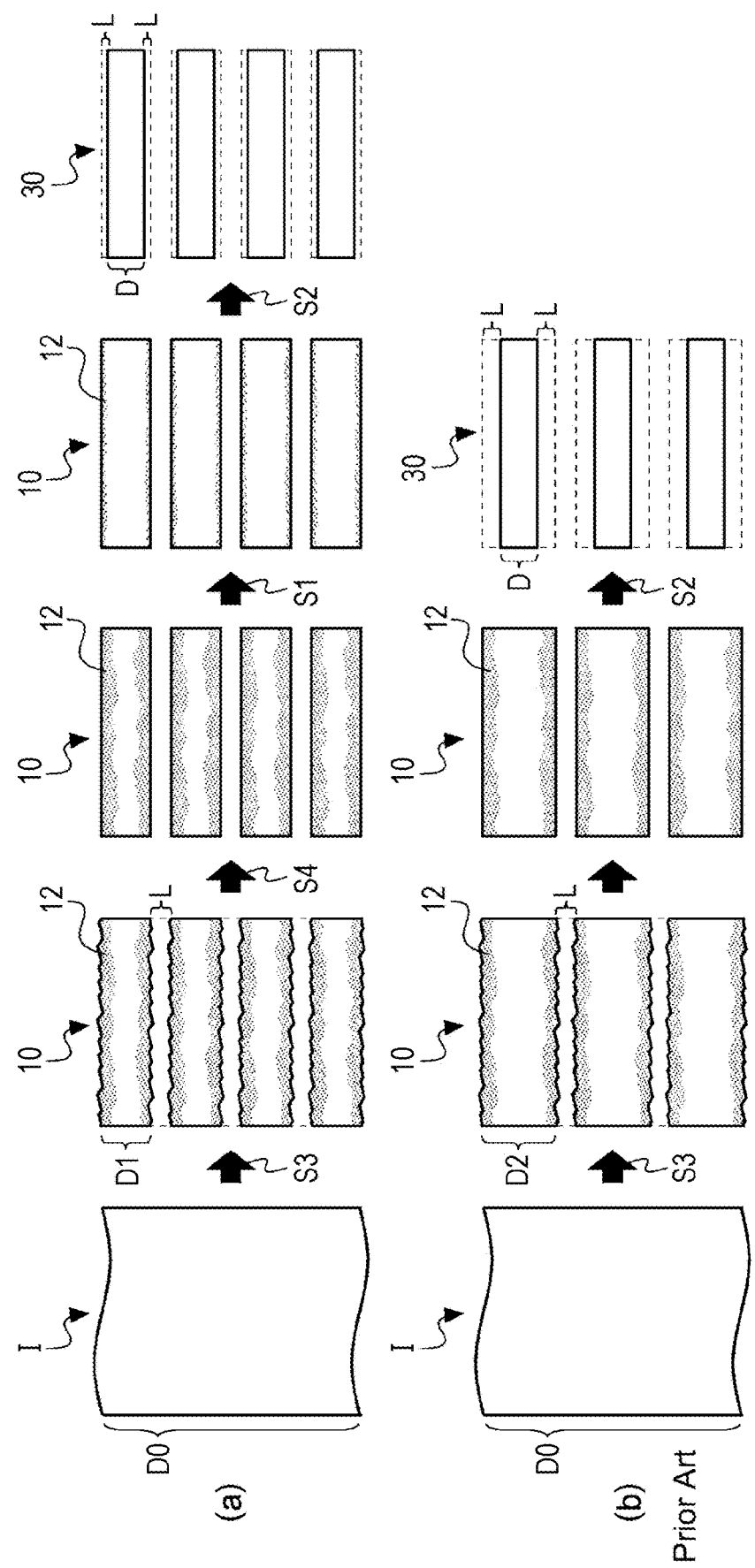
FIG. 2 illustrates the production process of a SiC substrate according to an embodiment of the present invention.

FIGS. 1 and 2 illustrate a comparison between the method for producing a SiC substrate according to an embodiment of the present invention and that according to the related art.

FIG. 1 illustrates an embodiment in which a thin strained layer 12 is removed from a SiC substrate body 10 by thinning the strained layer 12. FIG. 2 illustrates an embodiment in which a SiC substrate 30 having a thickness D is obtained from an ingot I having a thickness D0.

As illustrated in FIGS. 1(a) to 1(c) and FIG. 2(a), the present invention is a method for producing a SiC substrate 30, including a strained layer thinning step S1 of thinning the strained layer 12 of the SiC substrate body 10 by moving (concentrating) the strained layer 12 to the surface side.

Specifically, the strained layer thinning step S1 is a step of moving the strained layer 12 before the strained layer removal step to the heat-treated surface side from a reference depth 20, where the reference depth 20 is the depth of the strained layer 12 before the strained layer thinning step.

The present invention is also a method for producing the SiC substrate 30, including a strained layer removal step S2 of removing the strained layer 12 moved by the strained layer thinning step S1. The strained layer removal step S2 is a step of removing at least a portion of the surface side from the reference depth 20.

FIG. 1(a) illustrates an embodiment in which the strained layer 12 is moved to the surface side while maintaining the substrate thickness of the SiC substrate body 10. FIG. 1(b) illustrates an embodiment in which the strained layer 12 is moved to the surface side while crystal-growing the SiC substrate body 10. FIG. 1(c) illustrates an embodiment in which the strained layer 12 is moved to the surface side while etching the SiC substrate body 10.

On the other hand, the related-art method includes the strained layer removal step S2 of removing the entire strained layer 12, As illustrated in FIG. 1(d). That is, in order to remove the strained layer 12, it is necessary to remove the SiC single crystal at least up to a position reaching the reference depth 20. Thus, when the introduced strained layer 12 is entirely removed, a large amount of material loss L will occur.

Accordingly, the present invention includes the strained layer thinning step S1 of thinning the strained layer 12 of the SiC substrate body 10 by moving (concentrating) the strained layer 12 to the surface side before (or along with) removing the strained layer 12. As a result, the amount of material loss L of the SiC substrate body 10 can be reduced compared to the related-art method.

The embodiment of the present invention illustrated in FIG. 2(a) is a method for producing the SiC substrate 30, including a slicing step S3 of slicing the ingot I to obtain the SiC substrate body 10, an etching step S4 of etching the surface of the SiC substrate body 10, a strained layer thinning step S1 of thinning the strained layer 12 of SiC substrate body 10 by moving (concentrating) the strained layer 12 to the surface side, and a strained layer removal step S2 of removing the moved strained layer 12.

According to the present invention, the amount of material loss L can be reduced by the strained layer thinning step S1. Therefore, the SiC substrate body 10 can be sliced to a thinner substrate thickness D1 than the related-art method. FIG. 2(a) illustrates the process of obtaining four SiC substrates 30 having a thickness D from an ingot I having a thickness D0.

On the other hand, the related-art method includes a strained layer removal step S2, which removes all of the strained layers 12 introduced into the SiC substrate body 10, As illustrated in FIG. 2(b). Therefore, in order to produce a SiC substrate 30 having a substrate thickness D produced in the present invention, it is necessary to slice the substrate to a substrate thickness D2, which is thicker than D1. FIG. 2(b) illustrates the process of obtaining three SiC substrates 30 having a substrate thickness D from the ingot I having a thickness D0.

As described above, in the case of obtaining the SiC substrate 30 with the same substrate thickness D starting from an ingot I having a thickness D0, the number of SiC substrates 30 obtained differs between the present invention, which includes the strained layer thinning step S1, and the related-art method, which does not include the strained layer thinning step S1.

That is, according to the present embodiment, the number of the SiC substrates 30 taken from one ingot can be increased and the unit price per substrate can be reduced by including the strained layer thinning step S1 of thinning the strained layer 12 of the SiC substrate body 10 by moving (concentrating) the strained layer 12 to the surface side.

The following is a detailed description of the slicing step S3, the etching step S4, the strained layer thinning step S1, and the strained layer removal step S2 in the order of the embodiment illustrated in FIG. 2.

<Slicing Step>

The slicing step S3 is a step of slicing the SiC substrate body 10 from an ingot I. Examples of the slicing method in the slicing step S3 include multi-wire saw cutting, which cuts the ingot I at predetermined intervals by reciprocating a plurality of wires, electrical discharge machining, which cuts the ingot I by intermittently generating plasma discharge, and cutting the ingot I using a laser, where the laser is irradiated and focused into the ingot I to form a layer that serves as the base point for cutting.

The intervals cut in this slicing step S3 determine the substrate thickness of the SiC substrate body 10. The substrate thickness is set to a thickness in consideration of the single crystal SiC (material loss L) to be removed in a future processes. Thus, the slice thickness from the ingot I is set in consideration of the amount of material loss L after all the machining processes, and the specific values will be explained after all the processes are described.

<Etching Step>

The etching step S4 is a step of etching the surface of the SiC substrate body 10 after the slicing step S3. Examples of the etching method in the etching step S4 include thermal etching methods such as SiVE and hydrogen etching, and wet etching methods using potassium hydroxide melt, chemical solutions containing hydrofluoric acid, potassium permanganate-based chemicals, and chemical solutions containing tetramethylammonium hydroxide. Any chemical solution that is normally used in wet etching may be used.

In particular, the etching step S4 preferably etches the surface of the SiC substrate body 10 using a potassium hydroxide melt. By etching the surface of the SiC substrate body 10 with so-called KOH etching, the surface can be planarized while removing impurities attached in the slicing step S3.

Specifically, the SiC substrate body 10 after the slicing step S3 may be subjected to the etching step S4 using a potassium hydroxide melt, followed by the strained layer thinning step S1 and the strained layer removal step S2.

<Strained Layer Thinning Step>

The strained layer thinning step S1 is a step of heating the SiC substrate body 10 to at least 1400° C. in an environment containing Si elements By heating the SiC substrate body 10 in such an environment, the strained layer 12 can be moved and concentrated on the surface side of the SiC substrate body 10 without carbonizing the surface of the SiC substrate body 10.

Examples of the method that can be used in the strained layer thinning step S1 include the metastable solvent epitaxy (MSE) method, in which single crystal SiC is grown by heating a sandwich structure consisting of polycrystalline SiC and single crystal SiC via single crystalline Si, and the Si-vapor etching (SiVE) method, in which single crystal SiC is etched by heating under Si-vapor pressure.

That is, the heat treatment environment of the SiC substrate body 10 in the strained layer thinning step S1 is desirably a gas phase environment containing Si elements or a liquid phase environment containing Si elements.

In addition to the SiVE and MSE methods described above, the following methods may be used.

The strained layer thinning step S1 according to an embodiment of the present invention is a step of heating the SiC substrate body 10 in a semi-closed space containing a Si element supply source and a C element supply source.

Figure 3:
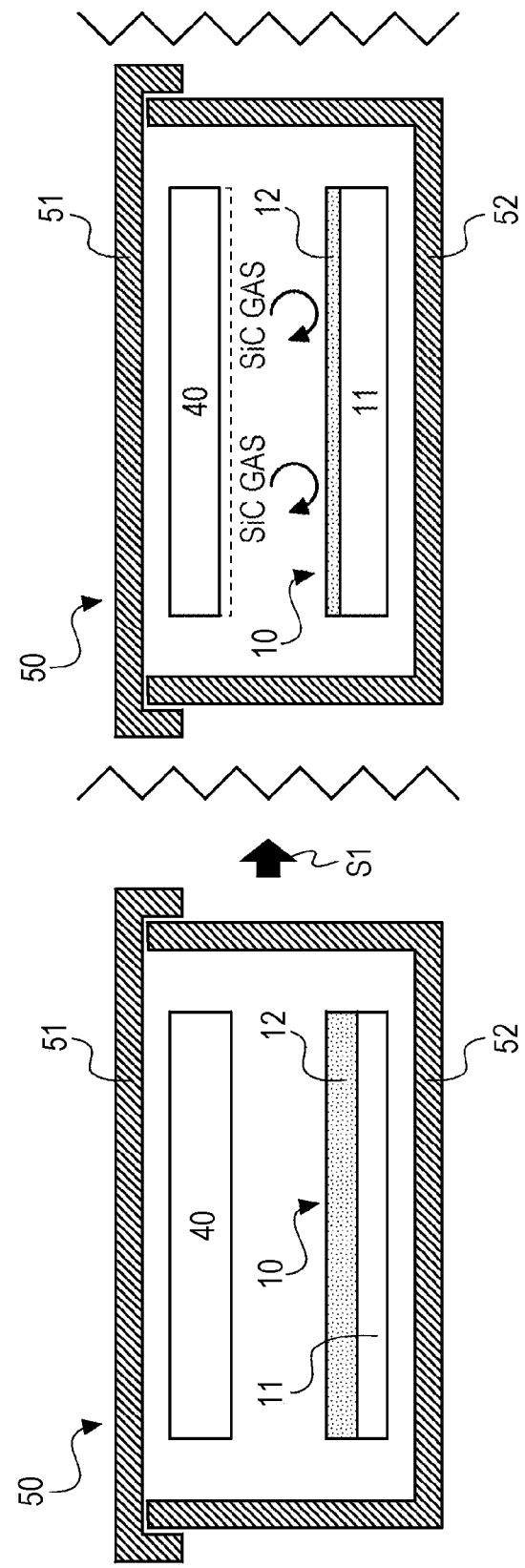
FIG. 3 illustrates an overview of the strained layer thinning step according to the embodiment.

Specifically, as illustrated in FIG. 3, the SiC substrate body 10 is placed in a main container 50 where the SiC material 40 (Si element supply source and C element supply source) is exposed. By heating the main container 50, a gas phase environment containing Si elements can be formed in the container.

As used herein, the "semi-closed space" refers to a space in which at least a portion of the vapor generated in the container can be confined, although the vacuation in the container is still possible. This semi-closed space can be formed in the main container 50 or in the refractory material container 70, as described below.

The SiC substrate body 10 may be, for example, a single crystal SiC processed into a plate shape. A specific example is a SiC wafer sliced into a disk from a SiC ingot produced by sublimation or other method. As for the crystal polymorphism of the single crystal SiC, any polytype may be used.

Normally, the SiC substrate body 10 that has undergone mechanical processing (for example, slicing, grinding, or polishing) or laser processing has the strained layer 12 in which the crystal lattice has been strained due to processing damage, and the bulk layer 11 having no such processing damage (see FIG. 1). In order to produce the high-quality SiC substrate 30, it is preferable to remove the strained layer 12 to reveal the bulk layer 11 having no processing damage.

Normally, a crack layer with many cracks (scratches) is introduced in addition to the strained layer 12 due to processing damage, but it is omitted because it is introduced at a shallower position than the strained layer 12. The crack layer and the strained layer 12 are collectively referred to as the subsurface damaged layer.

The presence or absence of the strained layer 12 and its depth can be confirmed by, for example, SEM-EBSD, TEM, sXRD, or Raman spectroscopy.

The SiC material 40 includes a SiC substrate and a SiC container (the main container 50 itself). That is, in an embodiment, apart from the SiC substrate body 10, a SiC substrate, which serves as the SiC material 40, is placed in the container (see FIGS. 4 and 5).

Figure 7:
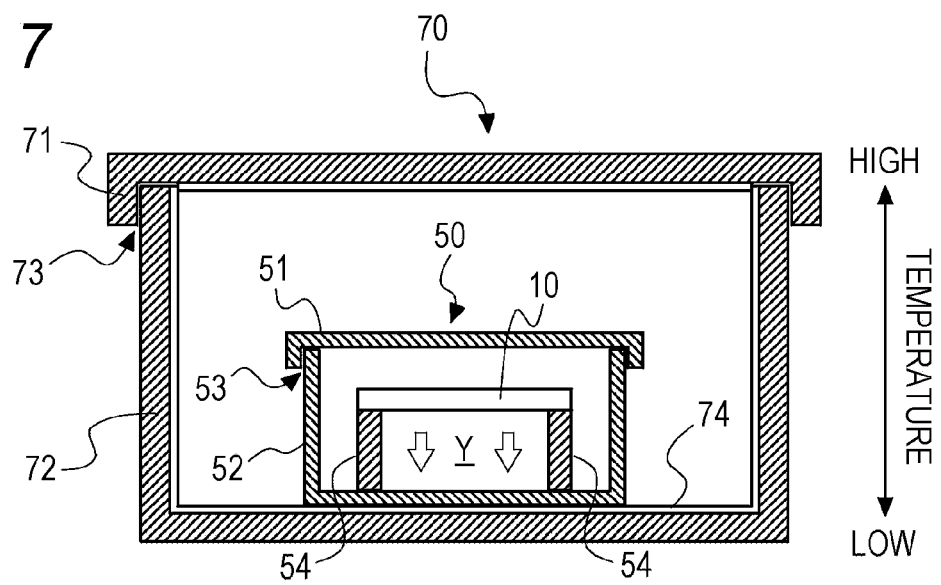
FIG. 7 illustrates the apparatus for producing a SiC substrate according to Example 1.

In another embodiment, at least a portion of the container that houses the SiC substrate body 10 is made of the SiC material 40 (see FIG. 7). In this case, the entire container may be made of the SiC material 40, or the part relative to the SiC substrate body 10 may be made of the SiC material 40.

When single crystal SiC is used as the SiC material 40, any polytype may be used.

The heated semi-closed space is preferably a vapor pressure environment of a mixture of a gas phase species containing Si elements and a gas phase species containing C elements. Examples of the gas phase species containing Si elements include Si, $Si_2$, $Si_3$, $Si_2C$, $SiC_2$, and SiC. Examples of the gas phase species containing C elements include $Si_2C$, $SiC_2$, SiC, and C. That is, the SiC-based gas is preferably exists in a semi-closed space.

The heating temperature in the strained layer thinning step S1 is preferably set in the range of from 1400 to 2300° C. It is even more preferably set in the range of from 1400 to 1600° C.

The heating time in the strained layer thinning step S1 can be set to any desired time to achieve the desired strained layer 12 depth.

By heating the SiC substrate body 10 in such an environment, the strained layer 12 can be moved (concentrated) to the surface side, and the strained layer 12 can be made thinner (see FIG. 3).

In the strained layer thinning step S1 according to the present embodiment, the SiC substrate body 10 and the SiC material 40 are placed relative to each other and heated so that a temperature gradient is formed between the SiC substrate body 10 and the SiC material 40, thereby thinning the strained layer 12 while crystal-growing or etching the SiC substrate body 10.

The following is a detailed description of the case with etching and the case with crystal growth.

[Strained Layer Thinning Step with Crystal Growth S1]

FIGS. 1(b) and 4 illustrate an overview of the strained layer thinning step S1 with crystal growth. As illustrated in FIG. 4, the SiC substrate body 10 and the SiC material 40 are placed relative to each other and heated with a temperature gradient between them to transport the raw materials (Si and C elements) from the SiC material 40 to the SiC substrate body 10 to grow single crystal SiC.

In the strained layer thinning step S1, the SiC substrate body 10 is placed in a semi-closed space where the SiC material 40 is exposed, and heated in the temperature range of from 1400° C. to 2300° C. This is thought to cause the following reactions 1) to 5) to occur continuously, resulting in the progression of crystal growth (see FIG. 4(b)).

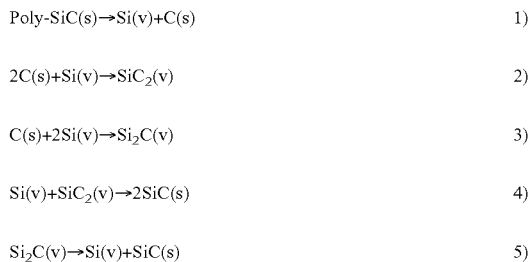

Si atoms (Si(v)) are desorbed from SiC by pyrolysis caused by heating of the SiC material (Poly-SiC(s)).

2) and 3): Due to the desorption of Si atoms (Si(v)), the remaining C atoms (C(s)) react with Si-vapor (Si(v)) in the semi-closed space. As a result, the C atoms (C(s)) sublimate in the semi-closed space as $Si_2C$, $SiC_2$, or the like.

4) and 5): The sublimated $Si_2C$, $SiC_2$, or the like reaches and diffuses into the terraces of the SiC substrate body 10 due to the temperature gradient (or chemical potential difference) and reaches the steps, and grows by taking over the polymorphism of the underlying SiC substrate body 10 (step-flow growth).

The strained layer thinning step S1 with crystal growth includes a Si atom sublimation step of thermally sublimating Si atoms from the surface of the SiC material 40, a C atom sublimation step of sublimating C atoms remaining on the surface of the SiC material 40 by reacting with Si-vapor in a semi-closed space, a raw material transport step of transporting the material to the surface of the SiC substrate body 10 using temperature gradients and chemical potential differences as driving forces, and a step-flow growth step of growing the raw material by reaching the steps of the SiC substrate body 10.

That is, the strained layer thinning step S1 with crystal growth is a step of placing the SiC substrate body 10 and the SiC material 40 relative to each other, and heating them so that the SiC substrate body 10 is on the low temperature side and the SiC material 40 is on the high temperature side. As a result, a crystal growth space X is formed between the SiC substrate body 10 and the SiC material 40, and the SiC substrate body 10 can be crystal-grown using the temperature gradient as a driving force, and the strained layer 12 can be moved to the surface side of the SiC substrate body 10.

[Strained Layer Thinning Step S1 with Etching]

FIG. 1(c) and FIG. 5 illustrates an overview of the strained layer thinning step S1 with etching. As illustrated in FIG. 5, the SiC substrate body 10 and the SiC material 40 are placed relative to each other and heated with a temperature gradient between them to transport the raw materials (Si and C elements) from the SiC substrate body 10 to the SiC material 40 to etch the SiC substrate body 10.

In the strained layer thinning step S1, the SiC substrate body 10 is placed in a semi-closed space where the SiC material 40 is exposed, and heated in the temperature range of from 1400° C. to 2300° C. This is thought to cause the following reactions 1) to 5) to occur continuously, resulting in the progression of etching (see FIG. 5(b)).

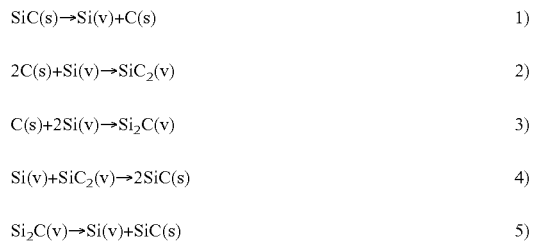

Si atoms (Si(v)) are desorbed from the surface of the SiC substrate body 10 by pyrolysis due to heating of the SiC substrate body 10 (SiC(s)) (Si atom sublimation step).

2) and 3): Due to the desorption of Si atoms (Si(v)), the remaining C (C(s)) on the SiC substrate body 10 surface reacts with Si-vapor (Si(v)) in the semi-closed space. As a result, the C (C(s)) sublimates from the surface of the SiC substrate body 10 as $Si_2C$, $SiC_2$, or the like (C atom sublimation step).

4) and 5): The sublimated $Si_2C$, $SiC_2$, or the like reaches the SiC material 40 in the semi-closed space by the temperature gradient and is crystal-grown.

As described above, the strained layer thinning step S1 with etching includes the Si atom sublimation step of thermally sublimating Si atoms from the surface of the SiC substrate body 10, and the C atom sublimation step of sublimating C atoms remaining on the surface of the SiC substrate body 10 from the surface of the SiC substrate body 10 by reacting the C atoms with Si-vapor in the semi-closed space.

That is, the strained layer thinning step S1 with etching is a step of placing the SiC substrate body 10 and the SiC material 40 relative to each other, and heating them so that the SiC substrate body 10 is on the high temperature side and the SiC material 40 is on the low temperature side.

As a result, an etching space Y is formed between the SiC substrate body 10 and the SiC material 40, and the SiC substrate body 10 can be etched using the temperature gradient as a driving force, and the strained layer 12 can be moved to the surface side of the SiC substrate body 10.

<Strained Layer Removal Step>

The strained layer removal step S2 is a step of removing the strained layer 12 that has been thinned by the strained layer thinning step S1. Specifically, it is a step of removing the strained layer 12 that has moved to the surface side from the reference depth 20, which is the depth of the strained layer 12 before the strained layer thinning step S1, and a step of removing at least a portion of the surface side from the reference depth 20 (FIGS. 1(a) to 1(c)).

Examples of the method used in the strained layer removal step S2 are CMP, SiVE, hydrogen etching, and the etching method described in the aforementioned [Strained layer thinning step with etching S1].

The strained layer removal step S2 in the related-art method generally involves the following steps: a rough grinding step using abrasive grains such as diamond, a finish grinding step using abrasive grains with a smaller grain size than those used in the rough grinding step, and a CMP step of performing polishing using both the mechanical action of the polishing pad and the chemical action of the slurry. In this related-art method, it was usual to remove all of the strained layer 12 introduced into the SiC substrate body 10 (see FIG. 1(d)).

In the strained layer removal step S2 according to the present invention, the strained layer 12 after the strained layer thinning step S1 is removed. Therefore, the strained layer 12 can be removed with a smaller amount of removal than the previously introduced strained layer depth (reference depth 20). As a result, the amount of SiC substrate body 10 removed in the strained layer removal step S2 of the present invention can be reduced compared to the related-art method.

The method for producing a SiC substrate according to the present invention includes a strained layer thinning step S1 of moving the strained layer 12 of the SiC substrate body 10 to the surface side to thin the strained layer 12. This can reduce the amount of material loss L in the strained layer removal step S2. This can also reduce the cost and processing time in the strained layer removal step S2.

In one example, the depth of the strained layer 12 (reference depth 20) of the SiC substrate body 10 before the strained layer thinning step S1 is 5 μm, and the depth of the strained layer 12 is reduced to 1 μm by the strained layer thinning step S1. At this time, it is sufficient to remove 1 μm of the SiC substrate body 10 in the strained layer removal step S2. That is, the material loss L of 4 μm can be reduced by including the strained layer thinning step S1, whereas the related-art method requires removal of 5 μm of the SiC substrate body 10. In addition, the consumables (for example, grinding wheel, blades, and abrasive grains) and processing time for machining can be reduced. Therefore, the cost of the strained layer removal step S2 can be significantly reduced.

According to the method for producing a SiC substrate according to the present embodiment, by using chemical mechanical polishing (CMP) for the strained layer removal step S2, it is possible to produce the SiC substrate 30 having an epi-ready surface while reducing the material loss L, cost, and processing time. By making the strained layer 12 thinner, the present invention can reduce the burden of CMP, the finishing process of the related-art method.

In the method for producing a SiC substrate according to the present embodiment, the desired substrate thickness can be obtained by using the strained layer thinning step S1 with crystal growth.

In the method for producing a SiC substrate according to the present embodiment, the strained layer thinning step S1 and the strained layer removal step S2 can be performed simultaneously by adopting the strained layer thinning step S1 with etching. This reduces the cost of introducing and subcontracting processes and equipment, thereby reducing costs.

In the method for producing a SiC substrate according to the present embodiment, the heating temperature for the strained layer thinning step S1 is 1400° C. or higher and 1600° C. or lower. Heating in such a temperature range reduces the burden on the apparatus. The lower the temperature of the heat treatment system, the more easily it can be introduced.

[Slice Thickness in Slicing Step]

Table 1 summarizes an example of the production of the SiC substrate 30 having a substrate thickness of 350 μm in each of the SiC substrate production methods of the present embodiment and the related-art method.

TABLE 1

| | | Thickness of SiC substrate body 10 | Depth of strained layer 12 (one surface) | Material loss L (both surfaces) |
|---|---|---|---|---|
| Present invention | Slicing step S40 | 400 μm | 10 μm or more | — |
| | Planarizing step S30 (lapping) | 352 μm | 8 to 12 μm | 4.8 μm |
| | Strained layer thinning step S10 | 352 μm | 0.5 to 1 μm | 0 μm |
| | Strained layer removal step S20 (chemical mechanical polishing) | 350 μm | 0 μm | 2 μm |
| | | | | Total material loss L 50 μm |
| Related-art method | Slicing step S40 | 450 μm | 10 μm or more | — |
| | Planarizing step S30 (lapping) | 402 μm | 8 to 12 μm | 4.8 μm |
| | Strained layer removal step S20 (Rough grinding step) | 380 μm | 5 to 8 μm | 2.2 μm |
| | Strained layer removal step S20 (Finish grinding step) | 360 μm | 3 to 5 μm | 2.0 μm |
| | Strained layer removal step S20 (chemical mechanical polishing) | 350 μm | 0 μm | 10 μm |
| | | | | Total material loss L 100 μm |

As depicted in Table 1, the related-art method results in a total material loss L of 100 μm. In particular, in the related-art method, it is common to remove more than 100 μm per the SiC substrate body 10 in order to ensure the removal of the strained layer 12 introduced in each step.

On the other hand, the amount of material loss L in the method for producing a SiC substrate of the present embodiment is 50 μm, as in Table 1. As described above, the present embodiment can significantly reduce the amount of material loss L in the production of SiC substrates.

The substrate thickness D1 of the SiC substrate body 10 to be cut from the ingot I in the slicing step S3 is set using this amount of material loss L as an index. Specifically, the substrate thickness D1 at the time of slicing is set by adding the amount of material loss L to the final substrate thickness D of the SiC substrate 30 (thickness of the SiC substrate 30 at the end of surface processing).

As described above, the thickness of the substrate D1 at the time of slicing is determined by adding the amount of material loss L to the thickness of the SiC substrate 30 after the completion of surface processing. As used herein, the term "surface processing" refers to the process of reducing the thickness of the SiC substrate body 10, such as the etching step S4 and the strained layer removal step S2.

Specifically, the thickness D1 of the substrate at the time of slicing is set by adding the amount of material loss L to the thickness of the SiC substrate 30 that has reached the point where the thickness does not decrease further by subsequent steps.

Therefore, it is preferable to set the substrate thickness D1 at the time of slicing as the sum of the substrate thickness D of the SiC substrate 30 plus a thickness of 37 µm or more as the lower limit, and more preferably 40 µm or more.

Furthermore, it is preferable to set the substrate thickness D1 at the time of slicing as the sum of the substrate thickness D of the SiC substrate 30 plus a thickness of 100 µm or less as an upper limit, more preferably 90 µm or less, even more preferably 80 µm or less, yet even more preferably 70 µm or less, yet even more preferably 60 µm or less, and yet even more preferably 50 µm or less. This allows the production of more SiC substrates 30 from one ingot I.

As aforementioned, in the related art, it is common to remove 100 µm or more per the SiC substrate 30. Therefore, a value obtained by adding a thickness of 100 µm or less, more preferably less than 100 µm as an upper limit, to the substrate thickness D of the SiC substrate 30 is preferably set as the substrate thickness D1 at the time of slicing. This allows the production of more SiC substrates 30 than when using the related-art method.

The substrate thickness D of the SiC substrate 30 that has undergone the slicing step S3 to the strained layer removal step S2 is, for example, typically from 100 to 600 µm, more typically from 150 to 550 µm, even more typically from 200 to 500 µm, yet even more typically from 250 to 450 µm, and yet even more typically from 300 to 400 µm.

That is, it is preferable to set the substrate thickness D1 at the time of slicing by adding the amount of material loss L by the method for producing a SiC substrate of the present invention to one of these typical substrate thicknesses of the SiC substrates 30.

Specifically, when it is desired to obtain the SiC substrate 30 having a substrate thickness D of 350 µm as the final product by the method for producing a SiC substrate of the present invention, it is preferable to obtain the SiC substrate 30 having the substrate thickness D1 at the time of slicing of 387 µm or more as the lower limit, more preferably 390 µm or more, and even more preferably 400 µm or more in the slicing step S3.

In this case, it is preferable to obtain the SiC substrate 30 having the substrate thickness D1 at the time of slicing of 450 µm or less as the upper limit, more preferably 440 µm or less, even more preferably 430 µm or less, yet even more preferably 420 µm or less, yet even more preferably 410 µm or less, and even more preferably 400 µm or less in the slicing step S3.

<<SiC Substrate Producing Apparatus>>

The following is a detailed description of the producing apparatus that realizes the method for producing a SiC substrate according to the present invention. In the present embodiment, components that are basically the same as those in the previous producing method are marked with the same reference numerals to simplify their description.

Figure 6:
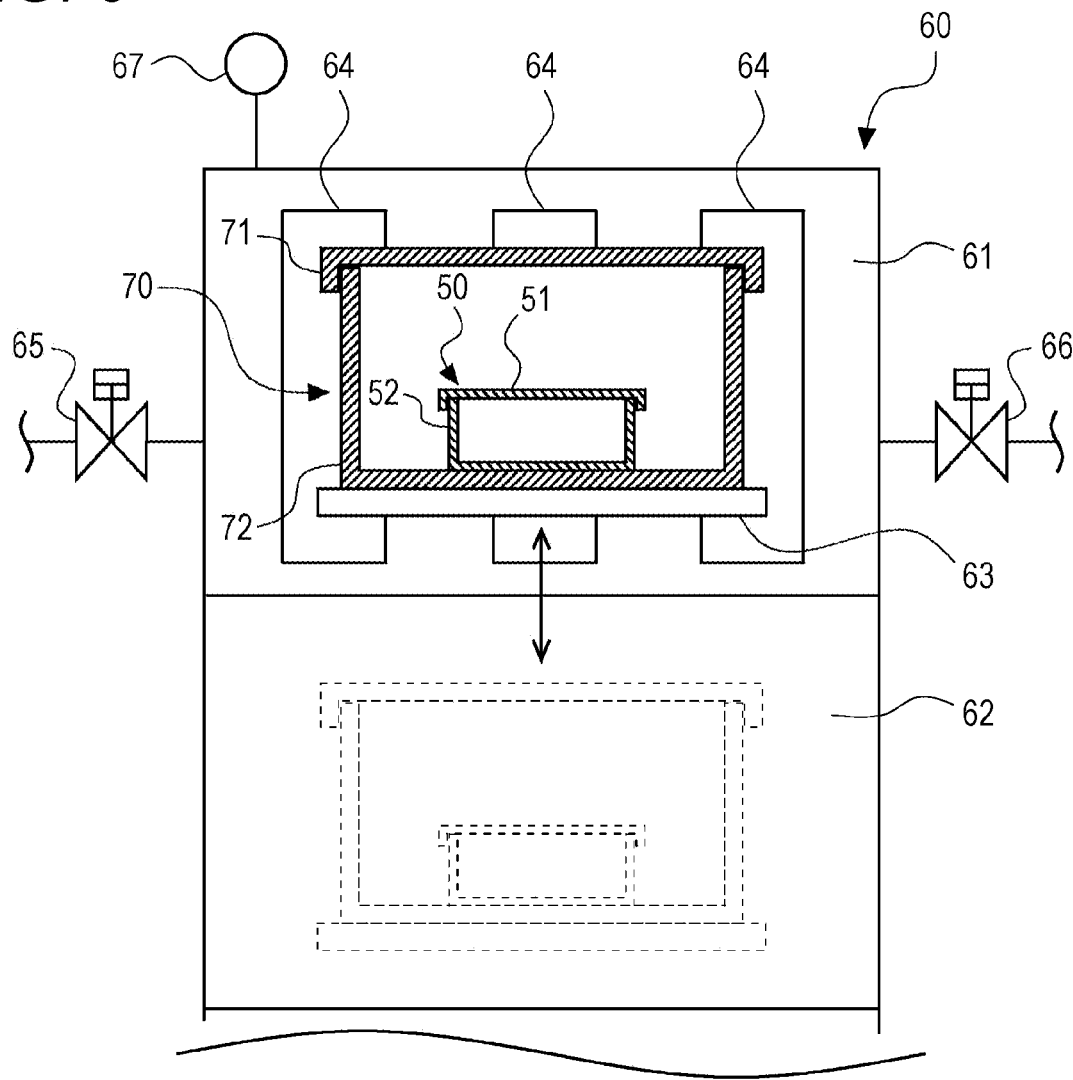
FIG. 6 illustrates the apparatus for producing a SiC substrate according to the embodiment.

As illustrated in FIG. 6, the SiC substrate producing apparatus according to the present embodiment includes the main container 50 capable of housing the SiC substrate body 10, and the heating furnace 60 capable of heating the SiC substrate body 10 and the SiC material 40 so that a temperature gradient is formed between them.

(Main Container)

The main container 50 is a fitting container including an upper container 51 and a lower container 52 that can be fitted to each other. A minute gap 53 is formed at the fitting part of the upper container 51 and the lower container 52, through which the inside of the main container 50 can be evacuated (vacuated).

The upper container 51 and the lower container 52 according to the present embodiment are made of polycrystalline SiC. Therefore, the main container 50 itself may be used as the SiC material 40. Alternatively, only the part of the main container 50 that is relative to the SiC substrate body 10 may be made of the SiC material 40. In this case, a high-melting point material (similar to the refractory material container 70 described below) may be used for parts other than the SiC material 40.

As illustrated in FIG. 3 or 5, the SiC material 40 in the form of a substrate may be housed separately. In this case, a spacer (such as a substrate holder 54) may be placed between the SiC material 40 in the form of a substrate and the SiC substrate body 10 to form a crystal growth space X or an etching space Y. The substrate holder 54 preferably includes the same high-melting point material as the refractory material container 70.

That is, the main container 50 is configured to generate an atmosphere containing Si and C elements in the internal space when heated with the SiC substrate body 10 contained. In the present embodiment, an atmosphere containing Si and C elements is formed in the internal space by heating the SiC material 40 including polycrystalline SiC.

The space inside the heated main container 50 is preferably a vapor pressure environment of a mixture of a gas phase species containing Si elements and a gas phase species containing C elements. Examples of the gas phase species containing Si elements include Si, $Si_2$, $Si_3$, $Si_2C$, $SiC_2$, and SiC. Examples of the gas phase species containing C elements include $Si_2C$, $SiC_2$, SiC, and C. That is, the SiC-based gas is preferably exists in a semi-closed space.

The crystal growth space X or the etching space Y is a space that transports raw materials from the SiC substrate body 10 to the SiC material 40 using the temperature gradient between the SiC substrate body 10 and the SiC material 40 as a driving force, and also transports raw materials from the SiC material 40 to the SiC substrate body 10.

For example, the SiC substrate body 10 is placed so that the temperature on the SiC substrate body 10 side is lower and the temperature of the SiC material 40 is higher in the comparison between the temperature of the surface of the SiC substrate body 10 and the temperature of the SiC material 40 relative to this surface (see FIG. 4). When the SiC substrate body 10 and the SiC material 40 are placed relative to each other and heated so that the SiC substrate body 10 is on the low temperature side and the SiC material 40 is on the high temperature side, the raw material is transported from the SiC material 40 to the SiC substrate body 10, and single crystal SiC grows on the SiC substrate body 10. That is, the crystal growth space X is formed between the SiC material 40 and the SiC substrate body 10.

On the other hand, the SiC substrate body 10 is placed so that the temperature on the SiC substrate body 10 side is higher and the temperature of the SiC material 40 is lower in the comparison between the temperature of the surface of the SiC substrate body 10 and the temperature of the SiC material 40 relative to this surface (see FIG. 5). When the SiC substrate body 10 and the SiC material 40 are placed relative to each other and heated so that the SiC substrate body 10 is on the high temperature side and the SiC material 40 is on the low temperature side, the raw materials are transported from the SiC substrate body 10 to the SiC material 40, and the SiC substrate body 10 is etched. As a result, an etching space Y is formed between the SiC material 40 and the SiC substrate body 10.

(Heating Furnace)

As illustrated in FIG. 6, the heating furnace 60 includes a main heating chamber 61 capable of heating the object to be treated (for example, the SiC substrate body 10) to a temperature of from 1000° C. to 2300° C., a preheating chamber 62 capable of preheating the object to be treated to a temperature of 500° C. or higher, a refractory material container 70 capable of housing the main container 50, and a moving means 63 (moving table) capable of moving the refractory material container 70 from the preheating chamber 62 to the main heating chamber 61.

The main heating chamber 61 is regular hexagonal in planar cross-sectional view, and the refractory material container 70 is placed inside it.

The main heating chamber 61 includes heaters 64 (mesh heaters). Multilayer heat-reflective metal plates are fixed to the side walls and ceiling of the main heating chamber 61 (not illustrated). The multilayer heat-reflective metal plates are configured to reflect the heat of the heaters 64 toward the substantially central portion of the main heating chamber 61.

As a result, in the main heating chamber 61, the heaters 64 are placed to surround the refractory material container 70 in which the object to be treated is housed, and the multilayer heat-reflective metal plate is placed outside the heaters 64 to increase the temperature to the temperature range of from 1000° C. to 2300° C.

The heaters 64 may be, for example, of resistance heating type or high-frequency induction heating type.

The heaters 64 may be configured to form a temperature gradient in the refractory material container 70. For example, the heaters 64 may be configured so that more heaters are placed on the upper side. The heaters 64 may be configured so that the width increases toward the upper side. Alternatively, the heaters 64 may be configured to be able to increase the power supplied toward the upper side.

The main heating chamber 61 is connected to a vacuum formation valve 65 for evacuating air from the main heating chamber 61, an inert gas injection valve 66 for introducing an inert gas into the main heating chamber 61, and a vacuum gauge 67 for measuring the degree of vacuum in the main heating chamber 61.

The vacuum formation valve 65 is connected to a vacuum pump (not illustrated) that evacuates air and vacuates the main heating chamber 61. By using the vacuum formation valve 65 and the vacuum pump, the degree of vacuum in the main heating chamber 61 can be adjusted to 10 Pa or less, more preferably to 1 Pa or less, and even more preferably to $10^{-3}$ Pa or less. Examples of the vacuum pump include a turbo molecular pump.

The inert gas injection valve 66 is connected to an inert gas supply source (not illustrated). This inert gas injection valve 66 and the inert gas supply source allow inert gas to be introduced into the main heating chamber 61 in the range of from 10-s to 10000 Pa. The inert gas may be, for example, Ar, He, or $N_2$.

The inert gas injection valve 66 is a dopant gas supply means that can supply a dopant gas into the main container 50. That is, by selecting a dopant gas (for example, $N_2$) as the inert gas, the doping concentration in the growth layer can be adjusted.

The preheating chamber 62 is connected to the main heating chamber 61, and is configured to allow the refractory material container 70 to be moved by the moving means 63. The preheating chamber 62 of the present embodiment is configured to be heated by the residual heat of the heater 64 of the main heating chamber 61. For example, when the main heating chamber 61 is heated to 2000° C., the preheating chamber 62 is heated to about 1000° C., which allows the degassing treatment of the object to be treated (for example, the SiC substrate body 10, the main container 50, or the refractory material container 70).

The moving means 63 is configured to place the refractory material container 70 and move it between the main heating chamber 61 and the preheating chamber 62. The transfer between the main heating chamber 61 and the preheating chamber 62 by the moving means 63 can be completed in as little as one minute, so that temperature rise and fall at from 1 to 1000° C./min can be achieved.

This ability to rapidly raise and lower the temperature makes it possible to observe the surface topography without low-temperature growth history during temperature rise and fall, which has been difficult with known apparatus.

In FIG. 6, the preheating chamber 62 is placed below the main heating chamber 61, but it may be placed in any other direction.

The moving means 63 according to the present embodiment is a moving table on which the refractory material container 70 is placed. A small amount of heat is released from the contact area between the moving table and the refractory material container 70. This forms a temperature gradient in the refractory material container 70 (and in the main container 50).

In the heating furnace 60 of the present embodiment, since the bottom of the refractory material container 70 is in contact with the moving table, a temperature gradient is provided so that the temperature decreases from the upper container 71 to the lower container 72 of the refractory material container 70. This temperature gradient is preferably formed along the front and back direction of the SiC substrate body 10.

The temperature gradient may be formed by the configuration of the heater 64 as described above. In addition, the heater 64 may be configured to reverse the temperature gradient.

(Refractory Material Container)

The heating furnace 60 is preferably capable of forming an atmosphere containing Si elements and heating the main container 50 in this atmosphere. The atmosphere containing Si elements in the heating furnace 60 according to the present embodiment is formed using the refractory material container 70 and the Si-vapor supply source 74.

Any method that enables the formation of an atmosphere containing Si elements around the main container 50 can naturally be used.

The refractory material container 70 includes a high-melting point material. Examples thereof include C which is a general-purpose heat-resistant material, W, Re, Os, Ta, and Mo which are high-melting point metals, $Ta_9C_8$, HfC, TaC, NbC, ZrC, $Ta_2C$, TiC, WC, and MoC which are carbides, HfN, TaN, BN, Ta$_2$N, ZrN, and TiN which are nitrides, HfB$_2$, TaB$_2$, ZrB$_2$, NB$_2$, and TiB$_2$ which are borides, and polycrystalline SiC.

This refractory material container 70, like the main container 50, is a fitting container including the upper container 71 and the lower container 72 that can be fitted to each other, and is configured to house the main container 50. A minute gap 73 is formed at the fitting portion between the upper container 71 and the lower container 72, through which the inside of the refractory material container 70 can be evacuated (vacuated).

The refractory material container 70 preferably has a Si-vapor supply source 55 that can supply vapor pressure of a gas phase species containing Si elements in the refractory material container 70. The Si-vapor supply source 55 should be configured to generate Si-vapor in the refractory material container 70 during heating, and examples thereof include solid Si (Si pellets such as single crystal Si pieces and Si powder) and Si compounds.

This SiC substrate producing apparatus according to the present embodiment uses TaC as the material of the refractory material container 70 and tantalum silicide as the Si-vapor supply source 55. That is, as illustrated in FIGS. 4 and 5, a tantalum silicide layer is formed inside the refractory material container 70, and the container is configured so that Si-vapor is supplied from the tantalum silicide layer into the container during heating, thereby forming a Si-vapor pressure environment.

Other configurations may be used as long as the vapor pressure of the gas phase species containing Si element is formed in the refractory material container 70 during heating.

Hereinafter, the present invention will be described more specifically with reference to Example 1.

EXAMPLES

Example 1: Movement of Strained Layer

The SiC substrate body 10 after the slicing step S3 was housed in the main container 50 and the refractory material container 70 (see FIG. 7) and heat-treated under the following heat treatment conditions. In Example 1, the main container 50 is made of polycrystalline SiC, so that the main container 50 itself functions as the SiC material 40 (Si element supply source and C element supply source).
[SiC Substrate Body 10]
  Polymorphism: 4H—SiC
  Substrate size: horizontal width 10 mm×vertical width 10 mm×thickness 0.45 mm
  Off-direction and off-angle: 4° off in <11-20> direction
  Heat-treated surface: (0001) plane
  Depth of strained layer 12: 3.5 µm
  The depth of the strained layer 12 was confirmed by SEM-EBSD. The strained layer 12 can also be confirmed by TEM, µXRD, or Raman spectroscopy.
[Main Container 50]
  Material: polycrystalline SiC
  Container size: diameter 60 mm×height 4 mm
  Material of substrate holder 54: single crystal SiC
  Distance between SiC substrate body 10 and the bottom of main container 50: 2 mm
[Refractory Material Container 70]
  Material: TaC
  Container size: 160 mm (diameter)×60 mm (height)
  Si-vapor supply source 74 (Si compound): TaSi$_2$

[Heat Treatment Conditions]
  The SiC substrate body 10 placed under the aforementioned conditions was heat-treated under the following conditions.
  Heating temperature: 1500° C.
  Heating time: 10 hours
  Etching amount: 40 nm
  Temperature gradient: 1° C./mm
  Degree of vacuum of main heating chamber: 10$^{-5}$ Pa
[Measurement of Strained Layer by SEM-EBSD]
The lattice strain of the SiC substrate body 10 can be determined by comparing it to a reference crystal lattice. For example, the SEM-EBSD method may be used as a means to measure the lattice strain. SEM-EBSD (electron back scattering diffraction) is a technique that can measure strain in a small region based on the Kikuchi diffraction figure obtained by electron backscattering using a scanning electron microscope (SEM). This method can determine the amount of lattice strain by comparing the diffraction figure of the reference crystal lattice and the measured crystal lattice.

As a reference crystal lattice, for example, a reference point is set in a region where no lattice strain is considered to have occurred. That is, it is desirable to place the reference point in the region of the bulk layer 11. Usually, the depth of the strained layer 12 is about 10 µm, according to the theory. Therefore, it is sufficient to set the reference point at a depth of about 20 to 35 µm, which is considered deep enough to be deeper than the strained layer 12.

Next, the diffraction figure of the crystal lattice at this reference point is compared with the diffraction figure of the crystal lattice in each measurement region measured at a pitch on the order of nanometers. As a result, the amount of lattice strain of each measurement region relative to the reference point can be calculated.

In the above, the case where a reference point where no lattice strain is considered to occur is set as the reference crystal lattice is described. However, it is also possible to use the ideal crystal lattice of single crystal SiC as the reference or the crystal lattice that occupies the majority (for example, more than the majority) of the measurement region plane as the reference.

By measuring the presence or absence of lattice strain using SEM-EBSD, the presence or absence of the strained layer 12 can be determined. That is, when strain is introduced by processing damage, lattice strain occurs in the SiC substrate body 10, and stress is observed by SEM-EBSD.

The strained layer 12 present in the SiC substrate body 10 of Example 1 before and after the strained layer thinning step S1 was observed by SEM-EBSD. The results are depicted in FIGS. 8(a) and 8(b).

In this measurement, a scanning electron microscope was used to measure the cross-section of the SiC substrate body 10 cleaved before and after the strained layer thinning step S1 of Example 1 under the following conditions.
  SEM equipment: Merline (Zeiss)
  EBSD analysis: OIM crystal orientation analysis system by TSL Solutions
  Acceleration voltage: 15 kV
  Probe current: 15 nA
  Step size: 200 nm
  Reference point R depth: 20 µm
  FIG. 8(a) is a cross-sectional SEM-EBSD imaging image of the SiC substrate body 10 before the strained layer thinning step S1 in Example 1.

Figure 8:
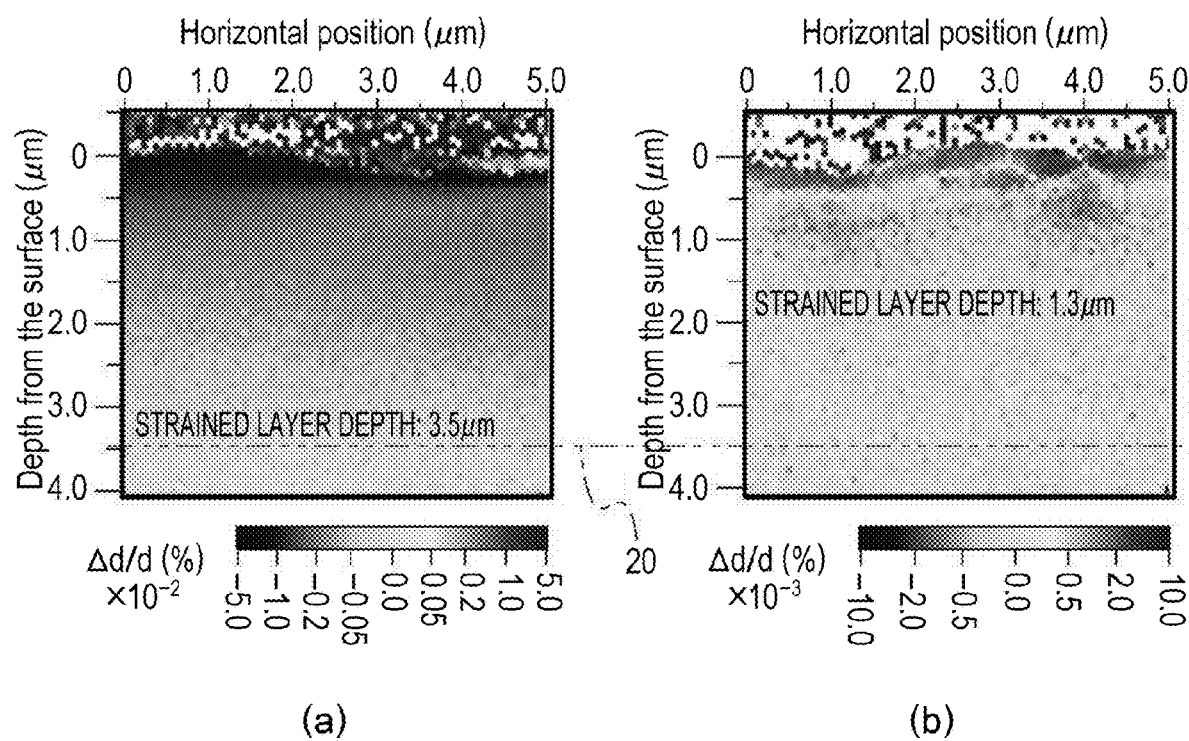
FIG. 8 illustrates the SiC substrate according to Example 1.

As illustrated in FIG. 8(a), before the strained layer thinning step S1, a lattice strain with a depth of 3.5 µm was observed in the SiC substrate body 10. This is the lattice strain introduced by the slicing step S3, and it can be seen that it has a strained layer 12. In FIG. 8(a), compressive stress is observed.

FIG. 8(b) is a cross-sectional SEM-EBSD imaging image of the SiC substrate body 10 after the strained layer thinning step S1 in Example 1.

As illustrated in FIG. 8(b), after the strained layer thinning step S1, a lattice strain with a depth of 1.3 μm was observed in the SiC substrate body 10. Since the etching amount during heat treatment was 40 nm, it can be seen that the strained layer 12 moved and concentrated about 2.2 μm to the surface side. In addition, the strained layer 12 can be moved further to the surface by increasing the heating time.

As described above, by heat-treating the SiC substrate body 10 in a semi-closed space containing Si and C element supply sources, the strained layer 12 can be moved and concentrated on the surface side of the SiC substrate body 10.

According to the present invention, by including the strained layer thinning step S1, the region that was removed as material loss in the conventional method can be reduced or decreased.

REFERENCE SIGNS LIST

10 SiC substrate body
11 Bulk layer
12 Strained layer
20 Reference depth
30 SiC substrate
40 SiC material
50 Main container
51 Upper container
52 Lower container
53 Gap
54 Substrate holder
55 Si-vapor supply source
60 Heating furnace
61 Main heating chamber
62 Preheating chamber
63 Moving means
64 Heater
65 Vacuum formation valve
66 Inert gas injection valve
67 Vacuum gauge
70 Refractory material container
71 Upper container
72 Lower container
73 Gap
74 Si-vapor supply source
X Crystal growth space
Y Etching space
S1 Strained layer thinning step
S2 Strained layer removal step
S3 Slicing step
S4 Etching step
I Ingot

The invention claimed is:

1. A method for producing a SiC substrate, comprising a strained layer thinning step of moving a strained layer of a SiC substrate body to a (0001) surface side to be thermally etched to thin the strained layer by thermal etching of the (0001) surface of the SiC substrate body and a strained layer removal step of removing the strained layer,
   wherein the strained layer thinning step is a step of placing the SiC substrate body in a main container entirely made of a SiC material in order to make the (0001) surface of the SiC substrate body and the SiC material face each other, and performing a heat treatment so as to form a temperature gradient that the (0001) surface of the SiC substrate body is at a high temperature side and the SiC material is at a low temperature side.

2. The method for producing a SiC substrate according to claim 1,
   wherein the strained layer thinning step is a step of moving the strained layer to the (0001) surface side from a reference depth, the reference depth being the depth of the strained layer before the strained layer thinning step, and
   wherein the strained layer removal step is a step of removing at least a portion of the (0001) surface side.

3. The method for producing a SiC substrate according to claim 2, wherein the strained layer removal step is chemical mechanical polishing.

4. The method for producing a SiC substrate according to claim 2, wherein the strained layer removal step is thermal etching.

5. The method for producing a SiC substrate according to claim 2, further comprising a slicing step of slicing an ingot to obtain the SiC substrate body,
   wherein the slicing step is a step of obtaining the SiC substrate body having a thickness obtained by adding a thickness of 100 μm or less to the thickness of the SiC substrate body after the strained layer removal step.

6. The method for producing a SiC substrate according to claim 5, wherein the slicing step is a step of obtaining the SiC substrate body having a thickness obtained by adding a thickness of 50 μm or less to the thickness of the SiC substrate body after the strained layer removal step.

7. The method for producing a SiC substrate according to claim 1, further comprising an etching step of etching the (0001) surface of the SiC substrate body,
   wherein the etching step is wet etching.

8. The method for producing a SiC substrate according to claim 7, wherein the etching step uses one or more kinds of etchants selected from the group consisting of a potassium hydroxide melt, chemical solutions containing hydrofluoric acid, a potassium permanganate-based chemical solution, and tetramethyl ammonium hydroxide.

9. The method for producing a SiC substrate according to claim 8, comprising a slicing step of slicing an ingot to obtain the SiC substrate body, and further comprising the slicing step, the etching step, and the strained layer thinning step in this order.

10. The method for producing the SiC substrate according to claim 1, wherein the heat treatment of the strained layer thinning step is carried out at a temperature of 1400° C. or higher and 1600° C. or lower.

11. The method for producing a SiC substrate according to claim 1, wherein the SiC material is placed in the main container or the SiC material is at least a portion of the main container.

* * * * *